United States Patent
Thackeray et al.

(10) Patent No.: US 9,983,477 B2
(45) Date of Patent: *May 29, 2018

(54) POLYMERS AND PHOTORESIST COMPOSITIONS

(75) Inventors: James W. Thackeray, Braintree, MA (US); Roger A. Nassar, Arlington, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 89 days.

This patent is subject to a terminal disclaimer.

(21) Appl. No.: 12/951,933

(22) Filed: Nov. 22, 2010

(65) Prior Publication Data

US 2011/0236823 A1 Sep. 29, 2011

Related U.S. Application Data

(63) Continuation of application No. 12/072,790, filed on Feb. 28, 2008, now Pat. No. 7,838,199.

(60) Provisional application No. 60/904,298, filed on Feb. 28, 2007.

(51) Int. Cl.
| | |
|---|---|
| *G03F 7/004* | (2006.01) |
| *G03F 7/038* | (2006.01) |
| *G03F 7/38* | (2006.01) |
| *G03F 7/039* | (2006.01) |

(52) U.S. Cl.
CPC .......... *G03F 7/0397* (2013.01); *G03F 7/0045* (2013.01); *G03F 7/0382* (2013.01); *G03F 7/38* (2013.01); *Y10S 430/106* (2013.01); *Y10S 430/111* (2013.01)

(58) Field of Classification Search
CPC .......... G03F 7/0397; G03F 7/038; G03F 7/30; C08L 33/10; C08F 228/00
USPC ..... 430/270.1, 325, 326, 910; 525/210, 212, 525/216, 227, 228; 526/243, 256, 281, 526/282, 287
See application file for complete search history.

(56) References Cited

U.S. PATENT DOCUMENTS

| | | | |
|---|---|---|---|
| 5,130,392 A | 7/1992 | Schwalm et al. | |
| 6,790,582 B1 * | 9/2004 | Eilbeck | G03F 7/0226 430/190 |
| 6,916,592 B2 * | 7/2005 | Harada et al. | 430/270.1 |
| 6,977,131 B2 | 12/2005 | Tao | |
| 7,078,147 B2 * | 7/2006 | Harada et al. | 430/270.1 |
| 7,125,641 B2 * | 10/2006 | Harada et al. | 430/270.1 |
| 7,459,261 B2 * | 12/2008 | Hatakeyama et al. | 430/270.1 |
| 7,838,199 B2 * | 11/2010 | Thackeray et al. | 430/270.1 |
| 7,932,334 B2 * | 4/2011 | Ando et al. | 526/243 |
| 2004/0131964 A1 * | 7/2004 | Furihata | G03F 7/023 430/190 |
| 2006/0147836 A1 | 7/2006 | Hatakeyama et al. | |
| 2012/0328985 A1 * | 12/2012 | Kato | G03F 7/0045 430/284.1 |

FOREIGN PATENT DOCUMENTS

| | | |
|---|---|---|
| EP | 1830227 A1 | 9/2007 |
| EP | 1897869 A1 | 3/2008 |
| JP | 2006234938 a * | 9/2006 |

OTHER PUBLICATIONS

English Language Summary of Office Action issued in corresponding Japanese Application No. 2013-209021, dated Aug. 11, 2014, (2 Pages).
English Language Summary of D2 (JP2005-084365 A) published Mar. 31, 2005 (3 Pages).
English Language Summary of D3 (JP2006-178317 A) published Jul. 6, 2006, (6 Pages).
English Language Summary of D5 (JP2006-234938 A) published Sep. 7, 2006 (4 Pages).

* cited by examiner

*Primary Examiner* — John S Chu
(74) *Attorney, Agent, or Firm* — Mintz Levin Cohn Ferris Glovsky and Popeo, P.C.; Peter F. Corless

(57) ABSTRACT

The invention relates to new polymers that comprise units that contain one or more photoacid generator groups and photoresists that contain the polymers. Preferred polymers of the invention are suitable for use in photoresists imaged at short wavelengths such as sub-250 nm or sub-200 nm, particularly 248 nm and 193 nm.

18 Claims, 2 Drawing Sheets

POLYMERS AND PHOTORESIST COMPOSITIONS

Figure 1:
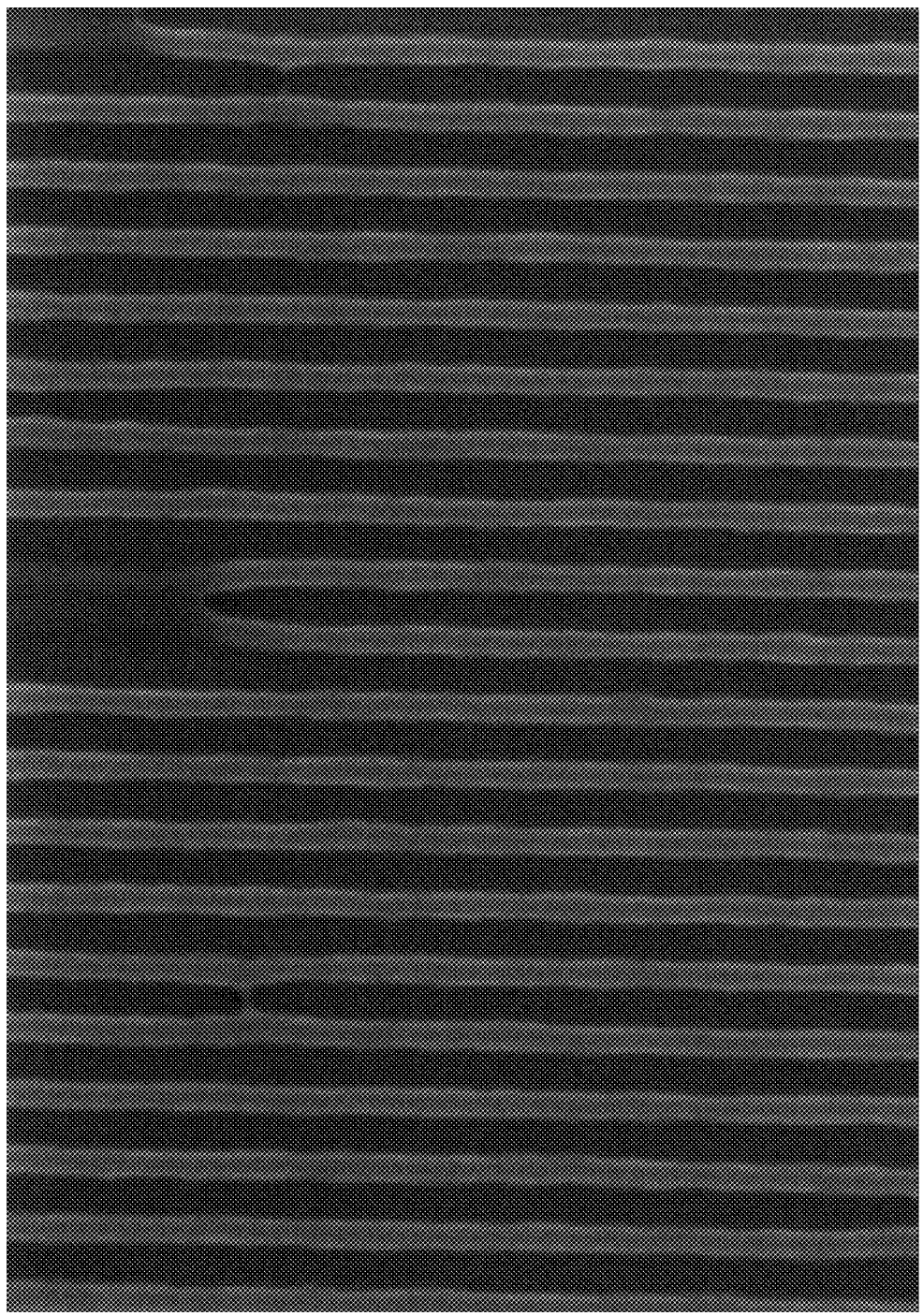

The present application is a continuation of U.S. application Ser. No. 12/072,790 filed Feb. 28, 2008, now issued as U.S. Pat. No. 7,838,199, which claims the benefit of U.S. provisional application No. 60/904,298, filed Feb. 28, 2007, which applications are each incorporated herein by reference.

The present invention relates to new polymers that comprise units that contain one or more photoacid generator groups and photoresists that comprise such polymers. Preferred polymers of the invention are suitable for use in photoresists imaged at short wavelengths such as sub-250 nm or sub-200 nm, particularly 248 nm and 193 nm.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

While currently available photoresists are suitable for many applications, current resists also can exhibit significant shortcomings, particularly in high performance applications such as formation of highly resolved sub-half micron and sub-quarter micron features. Certain efforts have been reported to covalently link a photoacid generator component to a resist resin. See U.S. Pat. No. 7,049,044. We have now found novel polymers and photoresist compositions that comprise the polymers as a resin component.

In a first aspect, polymers of the invention include higher order polymers that comprise (i) one or more covalently linked photoacid generator groups and (ii) one or more photoacid-labile groups. In this aspect, terpolymers, tetrapolymers and pentapolymers are particularly preferred, i.e. polymers that contain three, four and five distinct repeat units respectively.

In a further aspect, the invention includes blends of distinct polymers, where (i) a first polymer comprises one or more covalently linked photoacid generator groups and (ii) a second polymer (distinct from the first polymer) does not comprise photoacid generator groups. Preferably, at least one of the first and second polymers comprises photoacid-labile groups. In certain preferred embodiments, the second resin that does not comprise photoacid generator groups does contain photoacid-labile groups.

In another aspect, polymers are provided that comprise a covalently linked ionic photoacid generator group, such as a sulfonium group or iodonium group.

In yet another aspect, polymers are provided that comprise a covalently linked non-ionic photoacid generator group, such as imidosulfonates; oxime sulfonates; N-oxyimidosulfonates; disulfones; N-sulfonyloxyimides; nitrobenzyl compounds; and halogenated compounds.

In a further aspect, photoresist compositions of the invention may be free of any resins that comprise silicon (Si) substitution.

In a yet further embodiment, a polymer may comprise one or more repeat units that comprise carbon alicyclic groups such as adamantyl or norbornyl; aromatic groups such as naphthyl, hydroxyl naphthyl, phenol, phenyl, or anthracenyl; lactone such as gamma butyrolactone; cyano groups such as provided by polymerization of acrylonitrile or methacrylonitrile; hydroxyl; carboxy; sulfonamide; photoacid-labile groups such as photoacid-labile esters or acetals as may be provided by polymerization of an acrylate ester e.g. t-butyl acrylate or t-butylacrtlaye or an acetal formed by reaction of ethyl vinyl ether with a hydroxyl group.

In another aspect, preferred polymers may suitably comprise repeat units produced by polymerization of one or more reagents selected from the group of:

1) an electron deficient reagent or a reagent with one or more electron-withdrawing groups such as an anhydride including maleic anhydride or itaconic anhydride, or a halogenated olefin, particularly a fluorinated olefin such as tetrafluoroethylene (TFE) and the like;

2) a comparatively electron rich reagent (such as olefinic monomers not including an electron withdrawing group within one, two or three carbons of a vinyl group), e.g. an unsaturated alicyclic (e.g. endo- or exocyclic carbon-carbon double bond); or acyclic alkyl group suitably having from 3 to about 20 carbons, more typically 4 to about 20 carbons such as norbornene, cyclohexene, vinyl adamantyl and the like; or an unsaturated vinyl heteroalicyclic or heteroacyclic (particularly oxygen or sulfur heteroalicyclic and heteroalicyclic) such as to provide a polymerized cyclic ether (e.g. a tetrahydrofuran group fused to a polymer backbone) or cyclic thioether, alkoxy e.g. having 1 to about 12 carbon atoms, and the like; and 3) an acrylate (which includes substituted acrylates such as methacrylates), particularly acrylates that have a photoacid-labile group such as t-butyl acrylate, t-butyl methacrylate, adamantyl acrylate, adamantyl methacrylate, and the like.

Photoacid generator groups may be incorporated (covalently linked) to a polymer structure by a variety of approaches. For instance, a polymerizable monomer such as an acrylate monomer may include a photoacid generator moiety and such monomer may be reacted with other reagents to provide a polymer with repeat units that comprise the photoacid generator moiety. Alternatively, photoacid generator groups may be grafted on to formed polymers, e.g. a photoacid generator compound may be grafted onto a hydroxyl group of repeat units of a polymer.

Polymers of the invention may be preferably employed in photoresists imaged at sub-200 nm wavelengths such as 193 nm, and thus preferably will be substantially free of any phenyl or other aromatic groups. For example, preferred polymers contain less than about 10 mole percent aromatic groups, more preferably less than about 5, 4, 3, 2 or 1 mole percent aromatic groups. In certain aspects, particularly preferred polymers for 193 nm imaging are completely free of aromatic groups.

Polymers of the invention also may be suitably utilized in resists imaged at higher wavelengths, such as 248 nm. Such polymers suitably will contain aromatic groups such as provided by polymerization of a vinyl aromatic group, e.g. a vinylphenol, acetoxystyrene (where the acetoxy group can be de-blocked after polymerization to provide phenolic units), styrene, α-methylstyrene, vinyl naphthalene and the like.

The invention also includes negative-acting photoresists that comprise a polymer or polymer blend as disclosed herein. Negative-acting photoresists will preferably comprise a crosslinker component e.g. an amine-based materials such as a melamine resin or benzaguanamine resin.

The invention also provides methods for forming relief images, including methods for forming a highly resolved relief image such as a pattern of lines where each line has essentially vertical sidewalls and a line width of 0.25 microns or less. The invention further provides articles of manufacture comprising substrates such as a microelectronic wafer substrate, optoelectronic substrate or liquid crystal display or other flat panel display substrate having coated thereon a polymer, photoresist or resist relief image of the invention.

Other aspects of the invention are disclosed infra.

Figure 2:
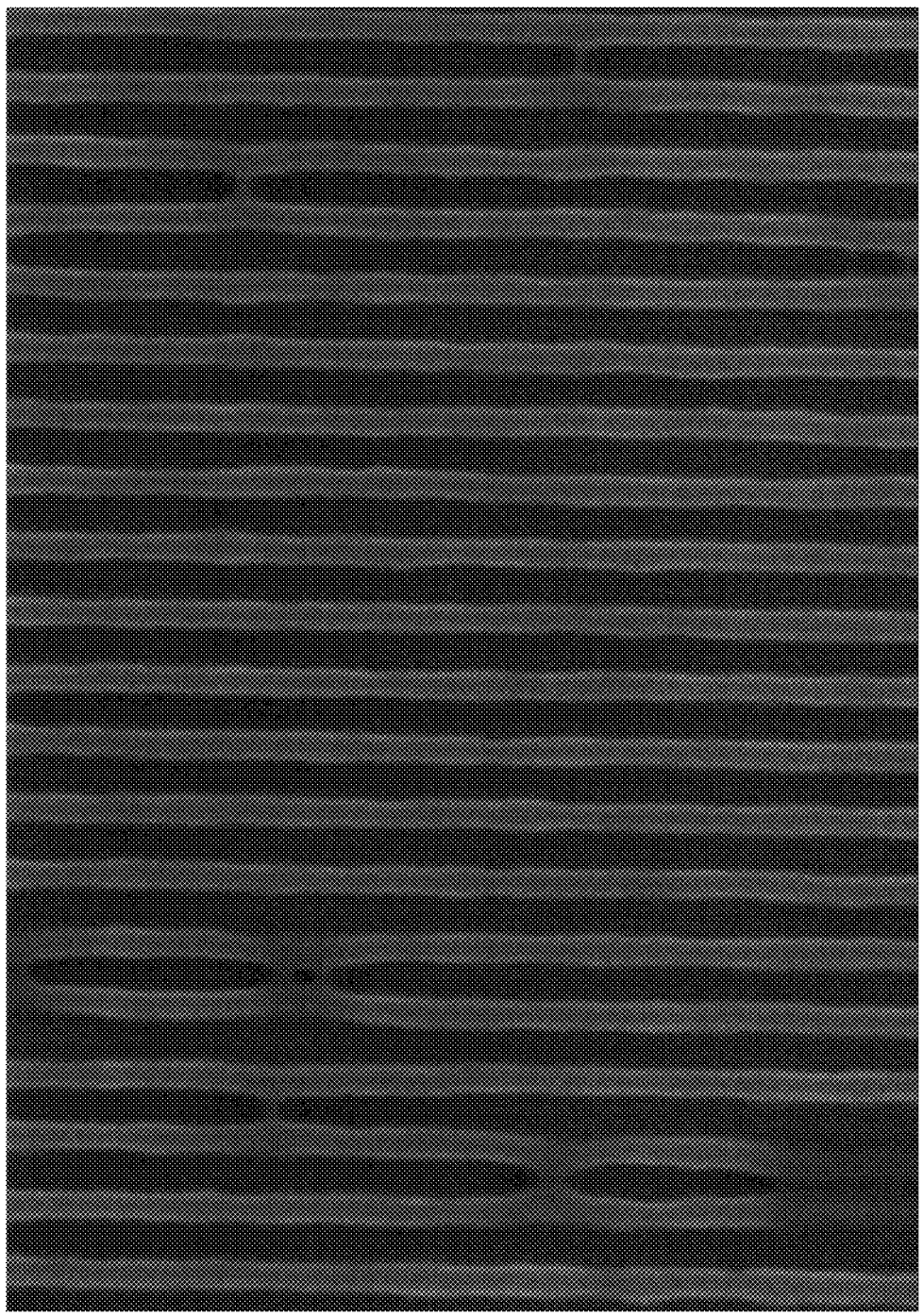

FIGS. 1 and 2 are scanning electron micrographs of photoresist relief images of Example 4 which follows.

As discussed above, we now provide new photoresist compositions that comprise a resin component that comprises one or more covalently linked photoacid generator groups.

Polymers

Polymers of the invention may include a variety of repeat units. Preferred polymers may comprise distinct repeat units, e.g. copolymers (at least two distinct repeat units in the polymer), terpolymers (three distinct repeat units), tetrapolymers (at least four distinct repeat units) and other higher order polymers.

Preferred polymerization reagents to provide a resin of the invention include an anhydride such as maleic anhydride; a lactone such as a butyrolactone; a fluorinated olefin such as tetrafluoroethylene; a carbon alicyclic group such as an optionally substituted norbornene or other cyclic olefin; a heteroalicyclic such as an optionally substituted dihydropyran; or an acrylate such as 2-methyladamantanyl methacrylate or 2-methyladamantanyl acrylate. As used herein, the term acrylate is inclusive of substituted acrylates such as methacrylates.

Thus, preferred polymers of the invention may contain i) repeat units with electron-withdrawing groups such as provided by polymerization of an anhydride or a fluorinated olefin and ii) repeat units of alicyclic groups (including carbon alicyclics i.e. the group has all carbon ring members and/or heteroalicyclic i.e. having one or more N, O or S atoms as ring members, preferably 1 or 2 oxygen or sulfur atoms as ring members) preferably where the alicyclic group is fused to the polymer backbone, e.g. the alicyclic ring has at least two carbon ring members that comprise the polymer backbone. Preferred fused carbon alicyclic groups are provided by polymerization of cyclic olefin (endocyclic double bond) compounds such as optionally substituted norbornene groups.

Additionally, an oxygen heteroalicyclic group preferably will be present in a polymer together with polymerized carbon alicyclic compounds such as optionally substituted norbornene.

As referred to herein, the term "carbon alicyclic group" means each ring member of the non-aromatic group is carbon. The carbon alicyclic group can have one or more endocyclic carbon-carbon double bonds, provided the ring is not aromatic.

As referred to herein, the term "heteroalicyclic group" means at least one ring member of the non-aromatic cyclic group is other than carbon, e.g. N, O or S, typically one or two oxygen or sulfur atoms. The heteroalicyclic group can have one or more endocyclic carbon-carbon double bonds, provided the ring is not aromatic. An oxygen heteroalicyclic group means that the group has at least one, and typically only one, oxygen ring atoms.

Preferred alicyclic polymer units carbon alicyclic or heteroalicyclic) may be substituted, e.g. by heteroalkyl groups such as ethers (alkoxy) preferably having 1 to about 10 carbon atoms, alkylthio preferably having 1 to about 10 carbon atoms, alkylsulfinyl preferably 1 to about 10 carbon atoms, alkylsulfonyl preferably having 1 to about 10 carbon atoms; optionally substituted alkyl groups including $C_{1-20}$ alkyl; esters including esters having from 2 to about 20 carbons; and the like.

In certain preferred systems, a resin may comprise repeat units that are provided by reacting polymerization reagents (e.g. unsaturated monomers) that comprise 1) an acrylate compound such as may provide a photoacid-labile group to the formed polymer (e.g. t-butyl acrylate; t-butyl methacrylate; adamantylacrylate, etc.); 2) an anhydride such as maleic anhydride; and/or 3) unsaturated carbon alicyclic compound such as optionally substituted norbornene and/or an unsaturated heteroalicyclic compound such as an optionally substituted dihydropyran.

Also in certain preferred systems and resists of the invention, the following polymers are suitable:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluorostyrene compound, and the like. Examples of such resins are disclosed e.g. in PCT/US99/21912.

As discussed, for use in positive-acting photoresist compositions, polymers suitably will include one or more units that comprise photoacid-labile moieties. The photoacid-labile group may be a substituent of one or more of the above-mentioned units, such as a substituent of a polymerized vinyl alicyclic ether, vinyl alicyclic thioether or carbon alicyclic group. The photoacid labile moiety also may be present as an additional polymer unit, e.g. as a polymerized alkyl acrylate or alkylmethacrylate, particularly an acrylate having an alicyclic moiety such as methyladamantyl acrylate or methyladamantyl methacrylate. Preferred alicyclic photoacid-labile moieties are tertiary ester alicyclic hydrocarbon groups that have two or more fused or bridged rings. Preferred tertiary ester groups include optionally substituted adamantyl, particularly methyl adamantyl as mentioned above; optionally substituted fencyl groups, particularly ethyl fencyl; optionally substituted pinnanyl; and optionally substituted tricyclo decanyl, particularly an alkyl-substituted tricyclo decanyl such as 8-ethyl-8-tricyclodecanyl e.g. as provided by polymerization of 8-ethyl-8-tricyclodecanyl acrylate and 8-ethyl-8-tricyclodecanyl methacrylate. Additional alicyclic ester groups also will be suitable, including additional bicyclic, tricyclic and other polycyclic moieties.

As discussed above, polymers of the invention preferably comprise contain one or more repeat units that comprise a photoacid-labile group. The photoacid-labile group may be e.g. a substituent of a heteroalicyclic or carbon alicyclic ring member. Alternatively, and generally preferred, the photoacid-labile moiety will be a polymer repeat unit distinct from repeat units containing a heteroalicyclic group. Preferably, that distinct unit may be an acrylate or methacrylate that comprises a photoacid-labile ester group. The photoacid-labile group also may be e.g. an acetal group such as many be provided by reaction of a vinyl ether with a hydroxy substituent of a polymer repeat unit.

Preferred photoacid-labile groups are ester groups, particularly esters that contain a tertiary alicyclic hydrocarbon ester moiety. Preferred tertiary alicyclic hydrocarbon ester moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e. —C(=O)O-TR' where T is a tertiary ring carbon of alicyclic group R'. In at least many cases, preferably a tertiary ring carbon of the alicyclic moiety will be covalently linked to the ester oxygen, such as exemplified by the below-depicted specifically preferred polymers. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(=O) O-TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

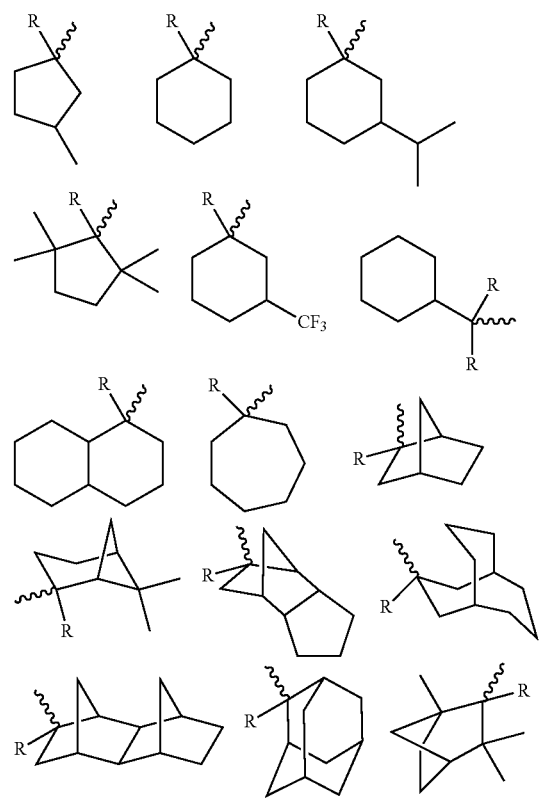

Particularly preferred tertiary alicyclic groups of photoacid-labile units include the following, where the wavy line depicts a bond to the carboxyloxygen of the ester group, and R is suitably optionally substituted alkyl, particularly $C_{1-8}$ alkyl such as methyl, ethyl, etc.

Polymers of the invention also may contain photoacid-labile groups that do not contain an alicyclic moiety. For example, polymers of the invention may contain photoacid-labile ester units, such as a photoacid-labile alkyl ester. Generally, the carboxyloxygen (i.e. the carboxyloxygen as underlined as follows: —C(=O)O) of the photoacid-labile ester will be covalently linked to the quaternary carbon. Branched photoacid-labile esters are generally preferred such as t-butyl and —C(CH$_3$)$_2$CH(CH$_3$)$_2$.

Polymers of the invention used in a chemically-amplified positive photoresist composition should contain a sufficient amount of photogenerated acid labile groups (e.g. esters and/or acetals) to enable formation of resist relief images as desired. For instance, suitable amount of such acid labile groups will be at least 1 mole percent of total units of the polymer, more preferably about 2 to 30 mole percent, still more typically about 3 to 20 or 30 mole percent of total polymer units.

As mentioned, polymers of the invention may contain a heteroalicyclic or carbon alicyclic ring that that is preferably fused to a polymer backbone. A fused heteroalicyclic ring unit preferably contains one or more oxygen and/or sulfur atoms. As indicated above, by stating herein that a cyclic group is fused to a polymer backbone, it is meant that two ring members of the cyclic group, typically two adjacent carbon atoms of the cyclic group, are also part of the polymer backbone. Such a fused ring can be provided by polymerizing a cyclic monomer that has an endocyclic double bond.

Preferred oxygen ring polymer units will be free of other hetero atoms such as sulfur (i.e. only oxygen and carbon ring members). Typically, the oxygen ring unit will contain one or two oxygen ring atoms and may have one or more ring substituents.

Preferred polymers of the invention may contain at least about 2 to 5 mole percent of fused heteroalicyclic units based on total units of the polymer; more preferably from about 5 to 50 mole percent of fused heteroalicyclic units based on total units of the polymer; still more preferably from about 5 or 10 to about 40 or 50 percent of fused heteroalicyclic units based on total units of the polymer.

Preferred polymers of the invention may contain at least about 2 to 5 mole percent of carbon alicyclic units based on total units of the polymer; more preferably from about 5 to 50 mole percent of fused carbon alicyclic units based on total units of the polymer; still more preferably from about 5 or 10 to about 25 or 30 percent of fused carbon alicyclic units based on total units of the polymer.

As discussed above, polymers of the invention also may contain additional units such as cyano units, lactone units or anhydride units. For example, acrylonitrile or methacrylonitrile may be polymerized to provide pendant cyano groups, or maleic anhydride may be polymerized to provide a fused anhydride unit.

In the synthesis of the invention, if conducted as a free radical addition, preferably the reaction is conducted under an inert atmosphere (e.g., N$_2$ or argon) and at elevated temperatures such as about 70° C. or greater, although reaction temperatures may vary depending on the reactivity of the particular reagents employed and the boiling point of the reaction solvent (if a solvent is employed) as generally discussed above. Suitable reaction solvents include e.g. tetrahydrofuran, dioxane, ethyl lactate, DMF and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed. A chain transfer agent or other agent to control radical flux or concentration also may be used in the reaction.

Monomers that can be reacted to provide a desired polymer of the invention can be identified by those skilled in the art. For example, to provide photoacid-labile units, suitable monomers include e.g. methacrylate or acrylate that contains the appropriate group substitution (e.g. tertiary alicyclic, t-butyl, etc.) on the carboxy oxygen of the ester group. Maleic anhydride is a preferred reagent to provide fused anhydride polymer units. Itaconic anhydride also is a preferred reagent to provide anhydride polymer units, preferably where the itaconic anhydride has purified such as by extraction with chloroform prior to polymerization. Vinyl lactones are also preferred reagents, such as alpha-butyrolactone. To incorporate a photoacid generator group into a polymer, a monomer containing photoacid generator groups (e.g. an acrylate monomer containing a photoacid generator moiety such as the acrylate photoacid generator of Example 1 which follows) can be co-polymerized with one or more other monomers. Other suitable and preferred reactive monomers and other reagents have been identified above.

Additional specifically preferred repeat units of polymers of the invention include hydroxyadamanyl groups (such as disclosed in U.S. patent Publication Ser. No. 10/082,769) and cyanoadamantyl groups (such as disclosed in U.S. Patent Publication 2005/0208418). These groups may be present on a polymer that comprise a covalently linked photoacid generator group, or a polymer that is free of photoacid generator groups.

Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less, even more preferably a molecular weight distribution of 1.5 or less or even 1.2 or 1 or less. The synthetic methods of the invention can provide such low (narrow) molecular weight distributions. Molecular weights (either Mw or Mn) of the polymers of the invention are suitably determined by gel permeation chromatography.

As discussed above, in one aspect of the invention blends of distinct polymers are provided where (i) a first polymer comprises one or more covalently linked photoacid generator groups and (ii) a second polymer (distinct from the first polymer) that does not comprise photoacid generator groups. Preferably, at least one of the first and second polymers comprises photoacid-labile groups. In certain preferred embodiments, the second resin that does not comprise photoacid generator groups does contain photoacid-labile groups. It is also suitable for both the first and second polymer to comprise photoacid labile groups.

In this aspect, the first and second polymers may be present in varying amounts. For example, the weight ratio of the first polymer:second polymer in a photoresist or resin blend of the invention is suitably from 1:10 to 10:1, or from 1:5 to 5:1.

Also in this aspect, the multiple distinct polymers suitably may be same class of polymers (e.g., both acrylates, cyclic olefin polymer (e.g. norbornyl/anhydride polymers), fluoropolymers), or the polymers may be of distinct classes, e.g. the first polymer may contain acrylate groups and the second polymer may comprise polymerized norbornyl and maleic anhydride groups (with no acrylate groups). The second polymer of the bend that does not contain photoacid generator groups may suitably comprise any of the repeat units or be of any of the polymer types as disclosed herein.

Photoacid Generator Groups

As discussed above, a variety of photoacid generator groups may be covalently linked to a resin in accordance with the invention.

In one aspect, ionic photoacid generator groups are covalently linked to a resin. References to an ionic photoacid generator group indicate that the acid is present in a salt form, e.g. such as an onium salt where an acid (e.g. sulfonium or iodonium) is complexed with an anionic species such as a carboxylate or sulfonate anion. Upon exposure to activating radiation (e.g. 193 nm or 248 nm), the ionic complex is dissociated to provide the active acid species.

In one embodiment of such ionic photoacid generator groups, the cationic moiety of an ionic photoacid generator group is covalently linked to a resin, but the anionic moiety is not covalently linked to the resin.

In a further embodiment of such ionic photoacid generator groups, the anionic moiety of an ionic photoacid generator group is covalently linked to a resin, but the cationic moiety is not covalently linked to the resin.

In a yet further embodiment of such ionic photoacid generator groups, both the anionic moiety and cationic moiety may be covalently linked to as resin.

In another aspect, non-ionic photoacid generator groups are covalently linked to a resin. References to a non-ionic photoacid generator group indicate that the group does not include an acid group complexed as a salt. Rather, activating radiation (e.g. 193 nm or 248 nm) will cause reaction of the group (e.g. bond-breaking reaction) to generate an acid moiety.

In one embodiment of such non-ionic photoacid generator groups, the acid moiety of a non-ionic photoacid generator group (which is "unmasked" by activating radiation) is covalently linked to a resin, while activating radiation liberates an acidic or non-acidic cleavage product (not covalently to the resin).

In further embodiment of such non-ionic photoacid generator groups, the acid moiety of a non-ionic photoacid generator group (which is "unmasked" by activating radiation such as 193 nm or 248 nm) is cleaved from a resin as a result of such photogeneration (i.e. no covalent linkage), while an acidic or non-acidic moiety of the photoacid generator group remains covalently linked to the resin.

In a yet further embodiment of such non-ionic photoacid generator groups, no cleavage product is generated upon exposure of the non-ionic photoacid generator group to activating radiation such as 193 nm or 248 nm.

As indicated, suitable ionic photoacid generator group may comprise one or more onium salts. Examples of suitable onium salts include for example, halonium salts, quaternary ammonium, phosphonium and arsonium salts, sulfonium salts and sulfoxonium salts or selenium salts. Onium salts have been described in the literature such as in U.S. Pat. Nos. 4,442,197; 4,603,101; and 4,624,912.

Generally preferred onium salts include iodonium salt photoacid generators, such as those compounds disclosed in published European application 0 708 368 A1. Such salts include those represented by the following formula:

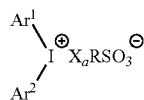

where $Ar^1$ and $Ar^2$ each independently represents a substituted or unsubstituted aryl group. A preferred example of the aryl group includes a $C_{6-14}$ monocyclic or a condensed ring aryl group. Preferred examples of the substituent on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom.

Sulfonium salts are particularly suitable ionic photoacid generators for PAG blends and resists of the invention, such as compounds of the following formula:

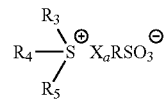

wherein $R^3$, $R^4$ and $R^5$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substituent on the alkyl group include a $C_{1-8}$ alkoxy group, a $C_{1-8}$ alkyl group, nitro group, carboxyl group, hydroxyl group, and a halogen atom. Preferred examples of the substituent on the aryl group include a $C_{1-8}$ alkoxy group, carboxyl group, an alkoxycarbonyl group, a $C_{1-8}$ haloalkyl group, a $C_{5-8}$ cycloalkyl group and a $C_{1-8}$ alkylthio group. Two of $R^3$, $R^4$ and $R^5$ and $Ar^1$ and $Ar^2$ may be connected to each other via its single bond or a substituent.

Ionic photoacid generator groups may comprise a variety of complexing (anionic) groups including e.g. anions of the formula $RSO_3^-$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononanesulfonate and the like.

Suitable non-ionic include imidosulfonates such as compounds of the following formula:

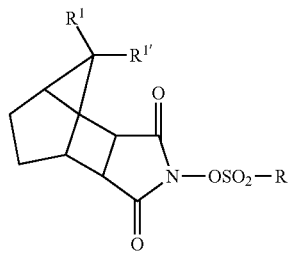

wherein each $R^1$ and $R^{1'}$ are each independently hydrogen or $C_{1-12}$ alkyl, more preferably hydrogen or methyl; and R is as defined above, i.e. alkyl (e.g. $C_{1-12}$ alkyl), camphor, adamantane and other cycloalkyl typically having from 5 to about 12 ring members, and perfluoroalkyl such as perfluoro ($C_{1-12}$alkyl), particularly perfluorinated groups such as perfluorooctanesulfonate, perfluorobutanesulfonate and the like. A specifically preferred photoacid generator of this class is N—[(perfluorooctane sulfonypoxy]-5-norbornene-2,3-dicarboximide.

N-sulfonyloxyimide photoacid generators also are suitable non-ionic photoacid generator groups, including those N-sulfonyloxyimides disclosed in International application WO94/10608, such as compounds of the following formula:

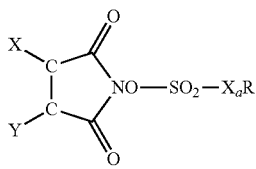

where the carbon atoms form a two carbon structure having a single, double or aromatic bond, or, alternatively, wherein they form a three carbon structure, that is, where the ring is instead a five member or six member ring; XaR is —$C_nH_{2n+1}$ where n=1 to 8, —$C_nF_{2n+1}$ where n=1 to 8, a camphor substituent, -2(9,10-diethoxyanthracene), —$(CH_2)_n$—Z or —$(CF_2)_n$—Z where n=1 to 4 and where Z is H, $C_{1-6}$ alkyl, a camphor substituent, -2-(9,10-diethoxyanthracene, or aryl such as phenyl; X and Y (1) form a cyclic or polycyclic ring which may contain one or more hetero atoms, or (2) form a fused aromatic ring, or (3) may be independently hydrogen, alkyl or aryl, or (4) may be attached to another sulfonyloxyimide containing residue, or (5) may be attached to a polymer chain or backbone, or alternatively, form

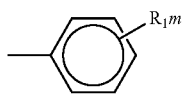

where $R_1$ is selected from the group consisting of H, acetyl, acetamido, alkyl having 1 to 4 carbons where m=1 to 3, $NO_2$ where m=1 to 2, F where m=1 to 5, Cl where m=1 to 2, $CF_3$ where m=1 to 2, and $OCH_3$ where m=1 to 2, and where m may otherwise be from 1 to 5, and combinations thereof, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

Additional preferred imidosulfonates include groups such as those of the following formula:

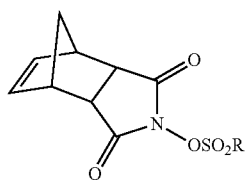

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred non-ionic photoacid generator group is N—[(perfluorooctanesulfonyl)oxy]-5-norbornene-2,3-dicarboximide.

Another class of suitable non-ionic photoacid generator groups includes additional sulfono groups such as disclosed in U.S. Pat. No. 5,558,976. Representative examples of these photoacid generators include:

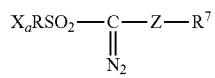

where XaR suitably is phenyl optionally substituted by halogen, $C_{1-6}$ alkyl, $C_{1-6}$ alkoxy, or $C_{1-6}$ haloalkyl, $R^7$ is a straight-chain, branched or cyclic alkyl group having from 1 to 10 carbon atoms and Z is a sulfonyl group or a carbonyl group:

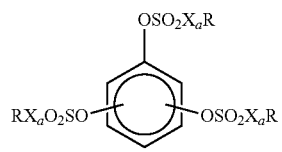

where R is as defined above; and

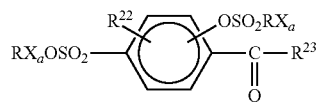

where $R^{22}$ is hydrogen, hydroxyl or a group represented by the formula $X_aRSO_2O$— where $X_aR$ is as defined above, and $R^{23}$ is a straight or branched alkyl group having from 1 to 5 carbon atoms or a group represented by the formula:

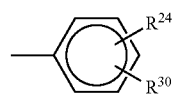

where $R^{24}$ and $R^{30}$ are independently a hydrogen atom, a halogen atom, a straight chain or branched alkyl group having 1-5 carbon atoms, a straight chain or branched alkoxy group having 1-5 carbon atoms, or a group of the formula:

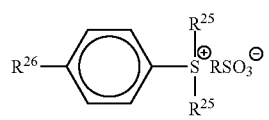

where each $R^{25}$ is independently a straight chain or branched alkyl group having 1-4 carbon atoms, a phenyl group, a substituted phenyl group or an aralkyl group; and $R^{26}$ is a hydrogen atom, a halogen atom or a straight-chain, branched or cyclic alkyl group having 1-6 carbon atoms.

Additional suitable non-ionic photoacid generator group include nitrobenzyl-based groups, including those disclosed in EPO published application No. EP 0 717 319 A1. Suitable nitrobenzyl-based compounds include those of the following formula:

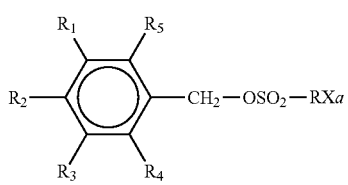

where each $R_1$, $R_2$ and $R_3$ are individually selected from the group consisting of hydrogen and lower alkyl group having from 1-4 carbon atoms; and $R_4$ and $R_5$ are individually selected from the group consisting of $CF_3$ and $NO_2$ and $RX_a$ is optionally substituted carbocyclic aryl, particularly optionally substituted phenyl such as phenyl where the 2, 3, and 4 position substituents are selected from hydrogen and $C_{1-4}$ alkyl and where the 5 and 6 ring positions are selected from $CF_3$, $NO_2$ and $SO3R'$ where $R'$ of optionally substituted $C_{1-12}$ alkyl or aryl such as phenyl where such optional substituents may be $C_{1-4}$ alkyl, $C_{1-4}$ alkoxy, $NO_2$ or $CF_3$.

Disulfone derivatives are also suitable non-ionic photoacid generator groups. Suitable groups are disclosed e.g. in published European application 0 708 368 A1. Such materials may be represented by the following formula:

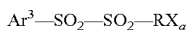

wherein $RX_a$ is preferably as defined immediately above and $Ar^3$ represents a substituted or unsubstituted aryl group. A preferred example of the aryl group includes a $C_{6-14}$ monocyclic or condensed-ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and halogen.

Oxime sulfonate and N-oxyimidosulfonate photoacid generator groups such as disclosed in U.S. Pat. No. 6,482, 567 also will be suitable for use in polymers of the invention.

Also suitable for covalent linkage to polymers of the invention will be photoacid generator groups that can generate α,α-difluoroalkyl sulfonic acid photoacid upon exposure to activating radiation, e.g. the photoacid generator groups of this type as disclosed in U.S. Pat. No. 6,849,374.

Further suitable for covalent linkage to polymers of the invention will be disulfone photoacid generator groups, including disulfone photoacid generator groups that contain a diazo, substituted methylene or hydrazine moiety interposed between substituted sulfone groups, e.g. the disulfone photoacid generator groups as disclosed in U.S. Pat. No. 6,783,912.

Halogenated non-ionic, photoacid generating compounds are also suitable for use in blends and resists of the invention and include, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6-hexachlorocyclohexane; N(1,1-bis[p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis (p-chlorophenyl)-2,2,2-trichloroethane (DDT); 1,1-bis(p-methoxyphenol)-2,2,2-trichloroethane; 1,1-bis (chlorophenyl)-2,2,2 trichloroethanol; tris(1,2,3-methanesulfonyl)benzene; and tris(trichloromethyl)triazine.

As discussed above, photoresist compositions of the invention may suitably non-polymeric photoacid generator compounds in addition to a polymer that comprises one or more covalently linked photoacid generator groups. Suitable photoacid generator compounds for such combined use are disclosed e.g. in U.S. Pat. Nos. 6,482,567; 6,783,912; 6,849, 374; and 6,458,506.

A photoresist of the invention should comprise a sufficient amount of photoacid generator groups to enable generation of a relief image upon lithographic processing (exposure and development). Such photoacid generator groups may be provided solely by photoacid generator groups covalently linked to a polymer of a photoresist, or a combination of photoacid generator groups covalently linked to a polymer and non-polymeric photoacid generator compounds present in the photoresist composition together with the polymeric photoacid generator. In general, total solids (all components except solvent carrier) of a photoresist may be at least 1, 2 or 3 weight percent photoacid generator groups, more typically total solids (all components except solvent carrier) of a photoresist may be at least 5, 8 or 10 weight percent photoacid generator groups. It is in general not necessary to employ photoacid generator groups in excess of about 25, 30, 35 or 40 weight percent of total solids of a photoresist composition.

Other Resist Components

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

Resist Preparation and Lithographic Processing

Photoresists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the Example 3 which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Resists of the invention also may be applied over an anti-reflective layer, particularly an organic antireflective layer.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm and 248 nm are particularly preferred exposure wavelengths. However, the resist compositions of the invention also may be suitably imaged at higher wavelengths.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

Example 1

Photoacid Generator Monomer Synthesis 4-hydroxy-2,3,5,6-tetrafluoro benzenesulfonate was prepared as described in Gee et al., Tetrahedron Letters, 1999, 40, 1471. This benzenesulfonate was then reacted with methacrylic acid in trifluoroacetic acid and trifluoroacetic anhydride under a nitrogen atmosphere overnight to obtain sodium 4-methacyloxy 2,3,5,6-tetrafluorobenzenesulfonate [$F_4$-MBS-Na] in 97% yield, characterized by $^1$H NMR (25° C., ppm) δ 7.42-7.92 (m, 15H), 6.45 (s, 1H), 6.12 (s, 1H), 2.03 (s, 3H); $^{13}$C (25° C., ppm) δ 162.8, 141.0, 136.3, 134.5, 133.1, 132.5, 131.3, 130.4, 128.7, 125.4, 124.2, and 17.9; $^{19}$F NMR (25° C., ppm, ext $CF_3COOH$) δ −152.55 (m, 2F), −137.62 (m, 2F); Anal. Calcl. for $C_{28}H20F4O5S2$: C, 58.33; H, 3.50; F, 13.18; O, 13.87; S, 11.12. Found C, 58.39; H, 3.34; F, 12.85; O, 13.83; S, 11.06.

Example 2

Polymer Synthesis 2.39 g of the free radial initiator V601 is admixed in 15 ml of degassed acetonitrile at room temperature.

Separately, the following four monomers in the following amounts are admixed in 24 ml of degassed acetonitrile: 4.63 grams of methyadamantylmethacrylate, 3.36 grams of alpha-butyrolactone methacerylate; 2.02 grams of cyanoadamanyl methacrylate; and 1.5 grams of the photoacid generator monomer prepared in Example 1 above.

The monomer mixture is then added over three hours to the initiator solution. When the first drop of the monomer mixture reaches the initiator solution, the initiator solution is submerged in 80° C. bath. Upon completion of addition, the mixture is refluxed for one additional hour. Then, the resultant polymer is precipitated by mixture with isopropanol, and the polymer is isolated by filtration and dried overnight at 40° C. under vacuum. After such drying, the polymer is dissolved in tetrahydrofuran (25-30 wt %), filter with 0.2 micron filter and then added to isopropanol slowly to provide a THF:isopropanol 1:10 v/v solution. The precipitated polymer is isolated by filtration and dried overnight at 40° C. under vacuum.

Example 3

Photoresist Preparation and Lithographic Processing

A photoresist of the invention is prepared by mixing the following components with amount expressed as weight percents based on total weight of the resist composition:

| Resist components | Amount (wt. % based on total solids) |
|---|---|
| Resin with PAG | 28.2 |
| Basic additive | 0.03 |
| Surfactant | 0.03 |

The resin is the polymer of Example 2 above. The basic additive is triisopropanol amine. The surfactant is Silwet (Dow Chemical). Those resist components were formulated at 16 wt. % solids in a solvent of 2-heptatone.

The formulated resist composition is spin coated onto HMDS vapor primed 4 inch silicon wafers and softbaked via a vacuum hotplate at 130° C. for 60 seconds. The resist coating layer is exposed through a photomask at 193 nm using an ISI microstepper, and then the exposed coating layers are post-exposure baked (PEB) at about 130° C. The coated wafers are then treated with alkaline aqueous developer (0.26N aqueous tetramethylammonium hydroxide solution to develop the imaged resist layer and provide a relief image.

Example 4

Further Lithographic Processing

FIGS. 1 and 2 are scanning electron micrographs (SEMs) of a photoresist of the type of Example 2 imaged with patterned 193 nm radiation and developed as described in Example 2 above to provide 25 nm lines as depicted.

What is claimed is:
1. A photoresist composition comprising:
    (i) a first polymer comprising one or more covalently linked non-ionic photoacid generator groups, wherein the first polymer comprises less than 10 mole percent aromatic groups; and
    (ii) second polymer that does not comprise photoacid generator groups.
2. The photoresist composition of claim 1 wherein the second polymer comprises photoacid-labile groups.
3. The photoresist composition of claim 1 wherein the polymer comprising photoacid generator groups further comprises carbon alicyclic, heteroalicyclic, anhydride, lactone, naphthyl, hydroxyl and/or acrylate groups.
4. The photoresist composition of claim 1 wherein the polymer comprising photoacid generator groups further comprises polymerized units of 2-methyladamantanyl methacrylate, 2-methyladamantanyl acrylate, hydroxyadamantylacrylate, hydroxyadamantylmethacrylate, maleic anhydride norbornene, 3,4-dihydropyran, optionally substituted phenyl or optionally substituted naphthyl.
5. A method for producing an electronic device, comprising:
    applying a coating layer of the photoresist composition of claim 2 on a substrate;
    exposing the photoresist coating layer to patterned activating radiation; and developing the exposed photoresist coating layer to provide a resist relief image.
6. The photoresist composition of claim 1, wherein the first polymer is completely free of aromatic groups.
7. The photoresist composition of claim 1 wherein the first polymer is a terpolymer.
8. The photoresist composition of claim 1 wherein the first polymer is a tetrapolymer.
9. The photoresist composition of claim 1 wherein the first polymer is a pentapolymer.
10. The photoresist composition of claim 1 wherein the first polymer or the second polymer comprises cyano groups.
11. The photoresist composition of claim 1 wherein the first polymer comprises acrylate groups and the second polymer does not contain acrylate groups.
12. A resin blend comprising:
    (i) a first polymer comprising one or more covalently linked non-ionic photoacid generator groups, wherein the first polymer comprises less than 10 mole percent aromatic groups; and
    (ii) a second polymer that does not comprise photoacid generator groups.
13. A negative-acting photoresist composition comprising the resin blend of claim 12.
14. A positive-acting photoresist composition comprising the resin blend of claim 12.
15. A photoresist composition comprising:
    (i) a first polymer comprising one or more covalently linked non-ionic photoacid generator groups; and
    (ii) a second polymer that does not comprise photoacid generator groups,
    wherein the first polymer or the second polymer comprises cyano groups.
16. The photoresist composition of claim 15 wherein the first polymer comprises acrylate groups and the second polymer does not contain acrylate groups.
17. The photoresist composition of claim 15 wherein the first polymer comprises cyano groups.
18. The photoresist composition of claim 15 wherein the first polymer comprises less than 10 mole percent aromatic groups.

* * * * *